United States Patent [19]

Hamano et al.

[11] Patent Number: 4,570,076
[45] Date of Patent: Feb. 11, 1986

[54] PHOTOELECTRIC CONVERTING DEVICE WITH POSITION-RELATED CONVERSION EFFICIENCY

[75] Inventors: Toshihisa Hamano; Hisao Itoh; Takeshi Nakamura, all of Ebina, Japan

[73] Assignee: Fuji Xerox Co., Ltd., Tokyo, Japan

[21] Appl. No.: 498,909

[22] Filed: May 27, 1983

[30] Foreign Application Priority Data

May 28, 1982 [JP] Japan .................................. 57-91034

[51] Int. Cl.[4] ............................................. H01J 40/14
[52] U.S. Cl. ................................. 250/578; 250/211 R; 358/212
[58] Field of Search ................ 250/216, 211 R, 211 J, 250/578, 234–236, 237 R, 211 K, 204; 355/68, 71; 358/212, 213, 293, 294

[56] References Cited

U.S. PATENT DOCUMENTS

| 3,414,730 | 12/1968 | Nicolas | 250/211 K |
| 3,889,117 | 6/1975 | Shaw | 250/578 |
| 4,218,623 | 8/1980 | Utagawa | 250/578 |
| 4,247,763 | 1/1981 | Stauffer | 250/204 |
| 4,307,372 | 12/1981 | Matsui et al. | 250/211 R |
| 4,495,422 | 1/1985 | Wiggins | 250/578 |

Primary Examiner—David C. Nelms
Attorney, Agent, or Firm—Handal & Morofsky

[57] ABSTRACT

A photoelectric converting device for use in an image pickup device is designed to obtain same photoelectric current from all photoelectric conversion elements which are disposed in array to form the photoelectric converting device. Variation in the quantity of incident light emitted from a light source on each element is compensated by intentionally varying the photoelectric conversion efficiency of each of a plurality of photoelectric conversion elements corresponding to its position in the array so that same photoelectric current flows through each element.

6 Claims, 9 Drawing Figures

PHOTOELECTRIC CONVERTING DEVICE WITH POSITION-RELATED CONVERSION EFFICIENCY

BACKGROUND OF THE INVENTION

The present invention relates to a photoelectric converting device, and in particular, to an improvement in the electrode structure of individual photoelectric conversion elements of an photoelectric converting device.

Generally, for a photoelectric converting device for use in image pickup devices the CCD (charged coupled device) type are widely known. This type, however, has a drawback in that overall image pickup device size cannot be made small due to the fact that it requires considerable optical path length owing to the necessity of the optical system to reduce the image to a proper extent as in ordinary cameras.

To solve such problem, a photoelectric converting device for dealing with real size images has been proposed recently. FIG. 1 shows an example of a photoelectric converting device of this type applied to the original reader of facsimile. In this figure, the original reader is accommodated in casings PA and PB, and consists of light sources 31 and 32, a lens array 20 which is an optical system for forming image, and an elongated photoelectric converting device 10. The photoelectric converting device 10 has its length corresponding to the width of the original OR to be placed on the casing PA, and its structure is such that the required number of divided electrodes 12 are provided on a substrate 11 on which a photoconductive layer 13 of amorphous silicon, selenium-Tellurium (Se-Te), organic semiconductor, or other suitable material is formed, and a light transmittable common electrode 14 is formed so as to cover the entire surface of the photoconductive layer 13. Each photoelectric conversion element (hereafter referred to simply as "element") which corresponds to a single picture element is comprised of a divided electrode 12, the photoconductive layer 13, and the common electrode 14, and the whole elements are formed to correspond to the full width of the original OR at a density of 8 elements/mm to 12 elements/mm, thus the photoelectric converting device 10 is constructed.

To achieve the reduction in the image pickup device size, an optical system capable of forming the original image on the photoelectric converting device in one to one correspondence, i.e., without enlargement and reduction, of image. The lens array 20 are provided for such an optical system. The lens array 20 is generally known as light converging fiber, typically structured by arranging light converging fiber 21 in a suitable holder at a density similar to or larger than that of aforementioned photoelectric conversion element, and disposed in such a manner that, as shown in FIG. 1, its optical axis is substantially vertical to the surface of the original OR set on the casing PA.

On both sides of the lens array 20 are disposed light sources 31 and 32, and light emitted through suitably provided slits 33 and 34 irradiates the original OR. That is, a glass plate 90 is provided in the casing PA corresponding to the width of the original OR, and the light emitted from the light sources 31 and 32 is cast as shown by arrows F1 in FIG. 1 on the original OR moving along the glass plate 90.

The light emitted from the light sources 31 and 32 is reflected at the surface of the original OR, enters and passes through the lens array 20 as shown by an arrow F2, and enters the photoelectric converting device 10 as shown in an arrow F3. Image reading scan of the original OR is performed by sequentially driving the elements of the photoelectric converting device 10.

For the light sources 31 and 32, a fluorescent lamps or LED arrays are employed, but the LED array involves a problem in the aspect of quantity of light.

FIG. 2 shows the quantity of light emission of the light source 31, 32 as measured in the longitudinal direction when a fluorescent lamp is used. As seen, when the quantity of light emission around the center of fluorescent lamp is taken as 100%, that of the end part LA, LB is around 80%.

On the other hand, since individual elements of the photoelectric converting device 10 are designed to have the same characteristic in photoelectric conversion, if the end portions LA, LB of the fluorescent lamps are used, sensing error would result. Accordingly, the light of the portion other than the portions LA and LB must be used, therefore, the construction must necessarily be such that the ends LA and LB of the light sources 31 and 32 protrude left and right. For example, for the photoelectric converting device 10 about 210 mm long, a fluorescent lamp as long as 320 mm is required.

To solve such problem, a method to process the output of the photoelectric converting device 10 electrically would be effective, but it requires special correction circuit.

SUMMARY OF THE INVENTION

The present invention has been made prompted by the prior art drawbacks as described above, and according to the invention a fluorescent lamp of the same length as that of the photoelectric converting device can be used without the need of a correction circuit.

Accordingly, it is an object of the present invention to provide a photoelectric converting device capable of reducing power consumption by the above-mentioned arrangement and of reducing the size of the device.

In order to achieve the above object of the present invention, noting the fact that in the photoelectric converting device employing a photo semiconductor as its photoelectric conversion element the photoelectric current changes in proportion to the area of the light receiving part of each element, an area whose location corresponds to the end part of the fluorescent lamp where the quantity of light is small is increased whereas an area which is located around the center of the fluorescent lamp where the quantity of light is large is reduced so that a uniform photoelectric current can be obtained through the entire element array.

In addition, in the present invention, noting the fact that the photoelectric current changes according to the photoconductivity of the photo semiconductor itself or transmittivity of the transparent electrode when the photo semiconductor is caused to receive light through the transparent electrode, it is designed so that uniform photoelectric current can be obtained over entire element array effectively by predetermining the photoconductivity of the photo semiconductor itself or the transmittivity of the transparent electrode so that the photoelectric conversion efficiency of each element becomes inversely proportional to the quantity of light emission at each part of the fluorescent lamp.

Accordingly, with the photoelectric converting device of the present invention, uniform photoelectric current can be obtained over the entire area of the light source even when a light source whose light emission varies according to the portion in the light source, like the fluorescent lamp, and neither a fluorescent lamp of extra length nor a special correction circuit is required.

Applying the present invention to CCD type and MOS type photoelectric converting device aside from the above mentioned elongated one is considered. Particularly, since the CCD type or MOS type photoelectric converting device requires the condensing optical system such as a convex lens, it becomes essential to correct the variation in the quantity of light according to $\cos^4\theta$ rule, i.e., the quantity of light decreases at the periphery of a lens compared with the center thereof. Accordingly, even employing such photoelectric converting devices, the variation of the quantity of light can be corrected effectively without the use of a special correction circuit providing that, for example, the area of the right receiving part of each element is appropriately determined in advance in the above mentioned embodiment. In sum, this invention is for changing the photoelectric conversion efficiency of each element in accordance with its location relative to the light source.

DESCRIPTION OF THE PREFERRED EMBODIMENT

Preferred embodiments of the present invention will now be presented in detail with reference to the accompanying drawings.

Figure 3:
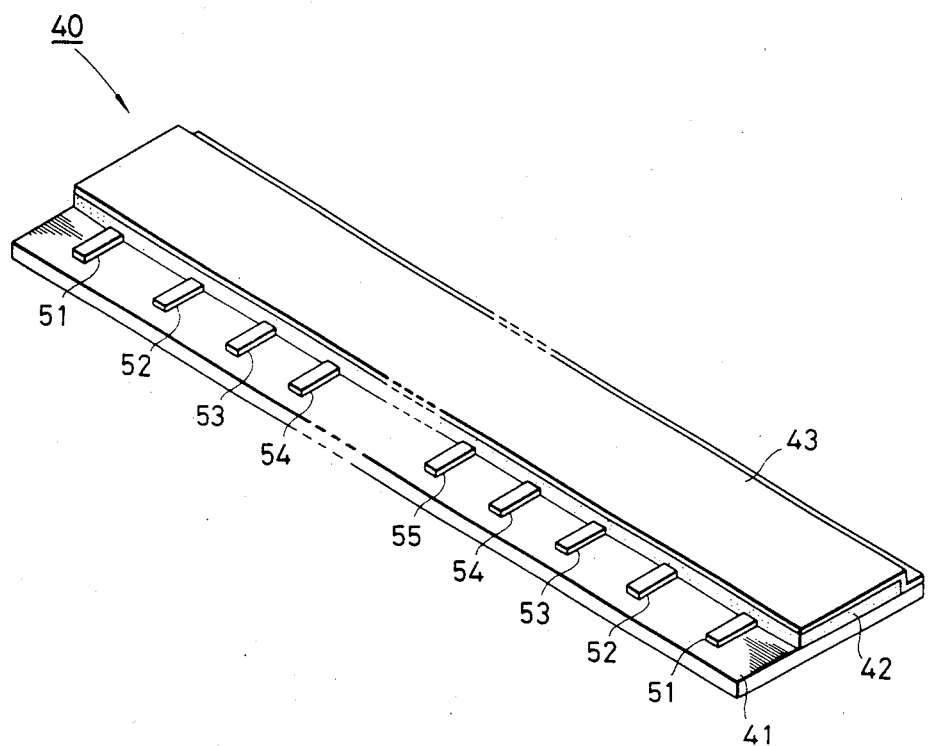
FIG. 3 illustrates an embodiment of the photoelectric converting device of the present invention.
Figure 4:
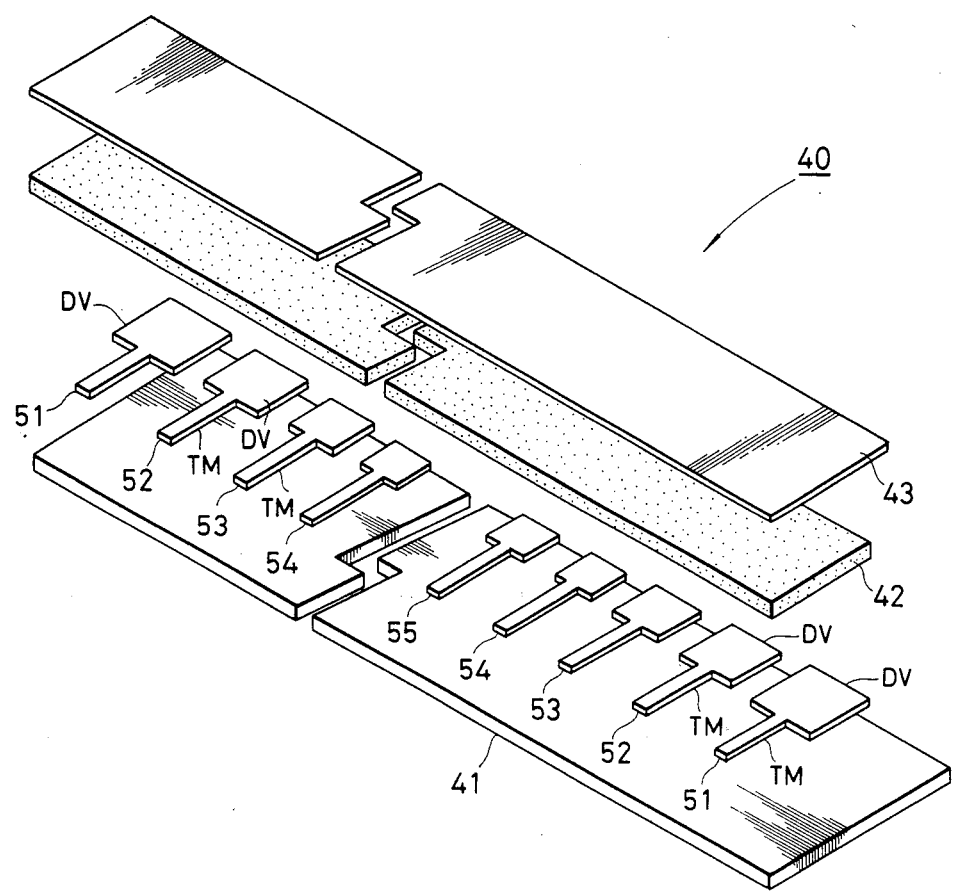
FIG. 4 illustrates the photoelectric converting device of FIG. 3 in a disassembled state.

Referring to FIGS. 3 and 4, a photoelectric converting device 40 is structured such that the required number of divided electrodes 51, 52 . . . are formed on an insulating substrate 41 at a fixed interval, a photoconductive layer 42 is formed thereon, and a common electrode 42 is provided to cover the entire surface. The divided electrode 51 is made of conductive material such as Cr, Al, Mo, Ni, W, Au, or Pd, and formed to have a light receiving electrode part DV of substantially square form and a lead electrode part TM extending forward as shown in FIG. 4. The light receiving electrode part DV mainly forms the light receiving part of the element, while the lead electrode part is mainly a portion to be electrically connected to an appropriate circuit to take out the photoelectric current of the element. The area of the light receiving electrode part DV is determined in accordance with the characteristic of the light source as described later.

A photoconductive layer 42 is made of photoconductive material such as selenium-tellurium-arsenic (Se-Te-As), amorphous silicon cadmium sulphide (CdS), and cadmium selenide (CdSe), and is provided over the divided electrodes 51, 52, . . . so as to sufficiently cover the light receiving electrode part DV. The material of the photoconductive layer 42 may be amorphous silicon device forming the p-i-n junction, or material into which boron (B), nitrogen (N), oxygen (O), or halogen (X) is doped, or it may be made of these materials combined in multilayer structure.

The common electrode 43 is a light transmissive metallic film of the material of any of $SnO_2$, ITO ($In_2O_3$-$SnO_2$), Al, An, Pt, and Pd.

Each photoelectric conversion element is formed by any one of the divided electrodes 51, 52, . . . , the photoconductive layer 42 and the common electrode 43, and a one-dimensional sandwich type photoelectric converting device 40 is formed by the required number of these elements arrayed in one direction.

Figure 5:
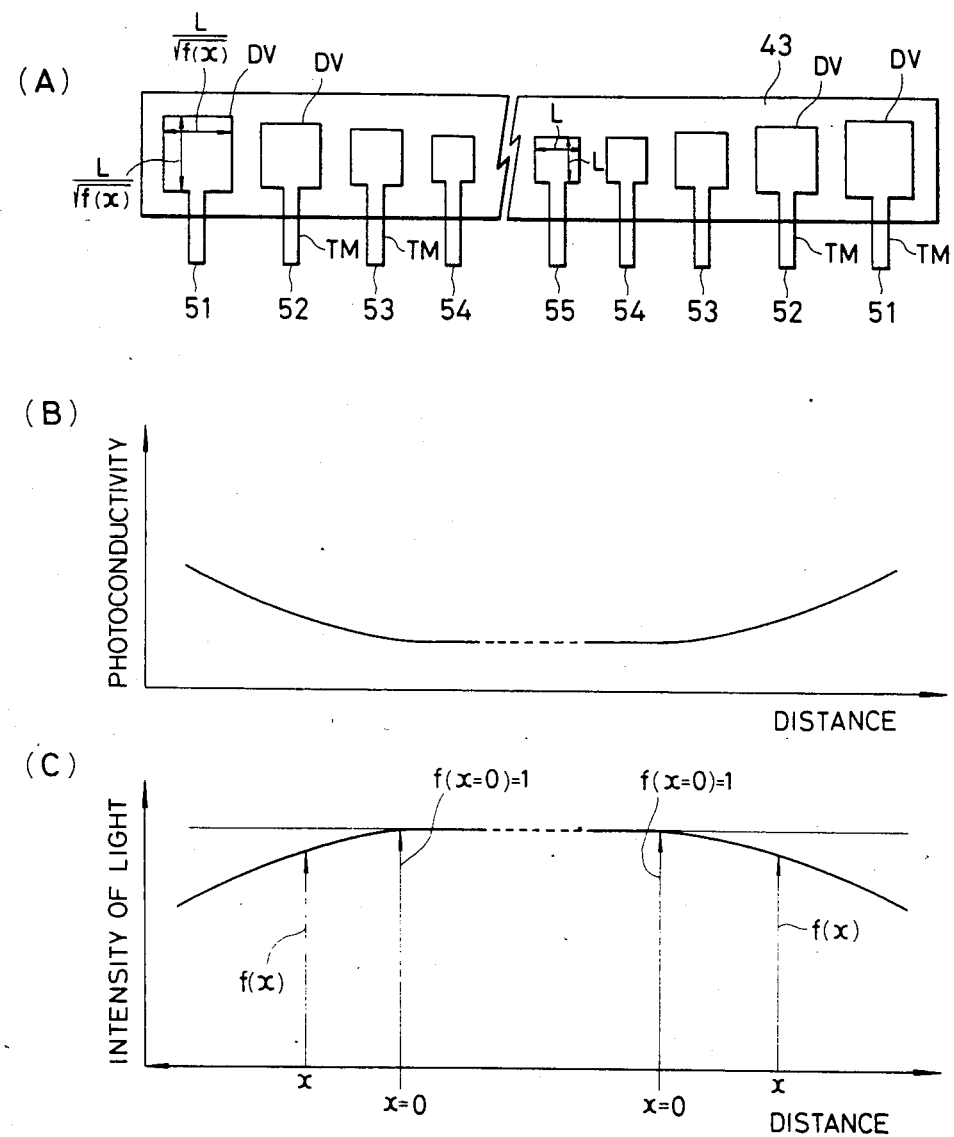
FIGS. 5(A), 5(B) and 5(C) illustrate typical improvements in the photoelectric conversion characteristic to be gained by the photoelectric converting device whose embodiment is shown in FIGS. 3 and 4.

FIG. 5 (A) schematically shows the divided electrodes 51, 52, . . . and the common electrode 43, in which the light receiving electrode part DV of the divided electrode 55 located relatively close to the center is formed with the side length being L, its area being $L_2$. The light receiving electrode part DV of the divided electrode 51 at the end has its side length of $L/\sqrt{F(x)}$ with its area being $L^2/F(x)$.

Figure 1:
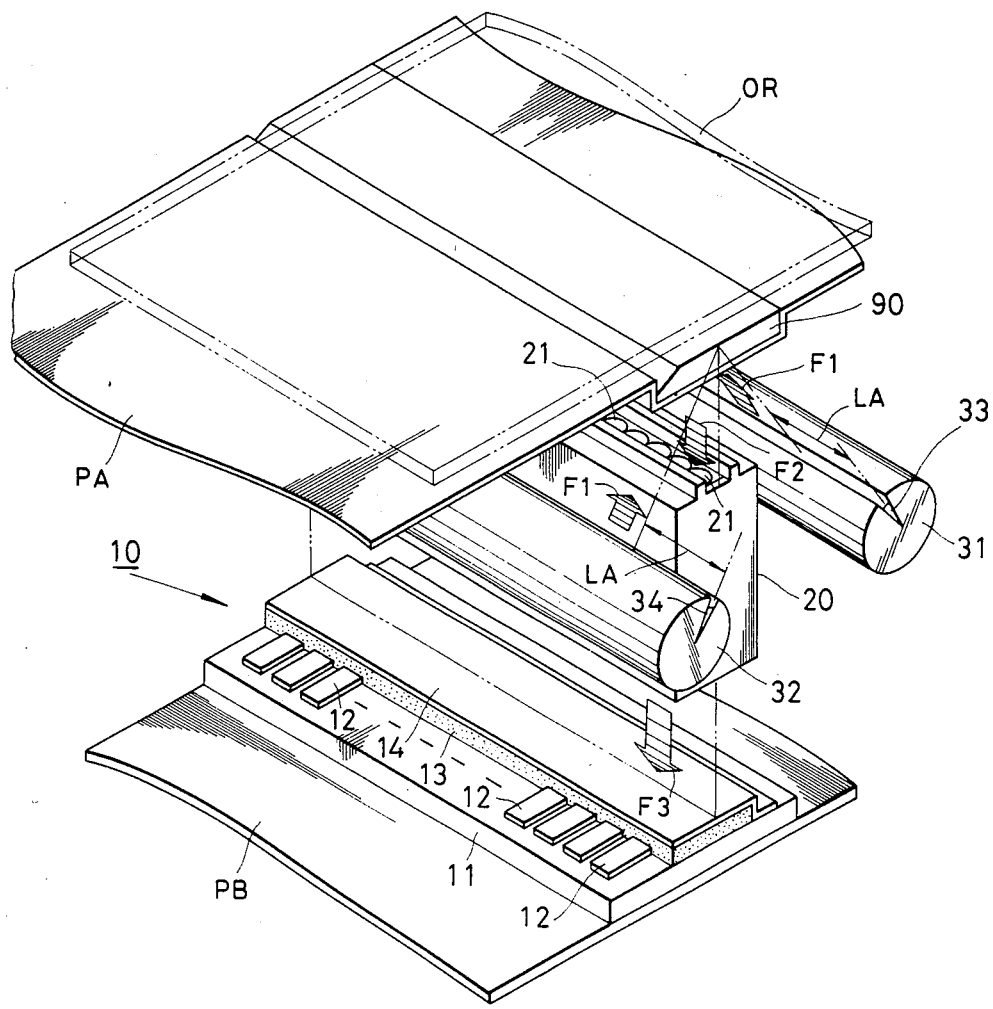
FIG. 1 is a perspective view showing the structure of the facsimile original reader employing prior art elongated photoelectric converting device.
Figure 2:
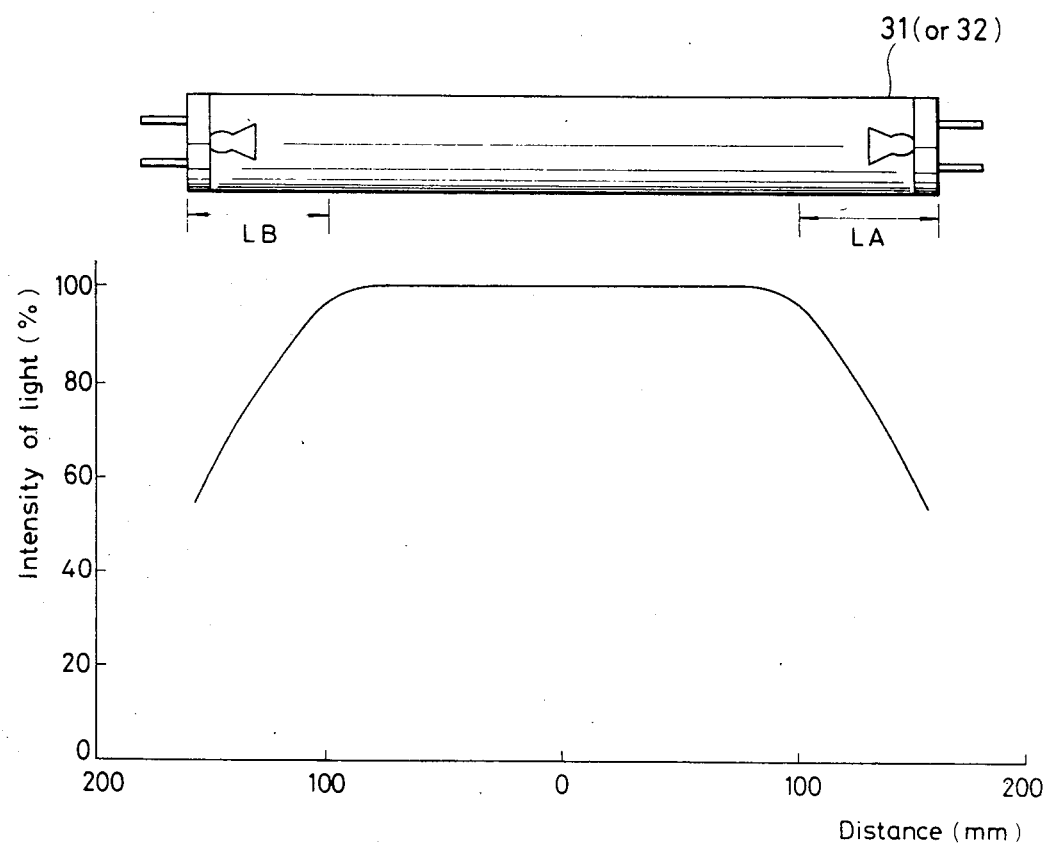
FIG. 2 is a diagram showing an example of quantity of light distribution of a fluorescent lamp.

Now, F(x) will be described. The solid line shown in FIG. 5(C) is the same as shown in FIG. 2, and indicates the relative quantity of light emission at each point of the fluorescent lamp having the same length as the photoelectric converting device. As mentioned previously, the fall at each end of the diagram indicates the decrease in the quantity of light emission at the end part of the fluorescent lamp, and F(x) is a function to represent the degree of this decrease with respect to the point at which the decrease begins. That is, the area of the light receiving electrode part DV is determined in accordance with the quantity of light emission of the light source in the position of the element. For example, when the quantity of light from the light source at a certain point is one-half that at around the center, i.e., 0.5, thus F(x) is 0.5. Accordingly, the length of a side of the light receiving electrode part DV of the element a that point is $L/\sqrt{0.5}$, and its area is $L^2/0.5$. Since the photoelectric current of the element is expressed by the product of the area of the light receiving electrode part DV and the quantity of incident light, the photoelectric current of this element is $0.5 \times (L^2/0.5) = L$, thus being equivalent to the photoelectric current of the element around the center. Generally, since the element located around the end at which the quantity of light emission of the light source falls to F(x) has the length of its side of $L\sqrt{F(x)}$ and the area of $L^2/F(x)$, the overall photoelectric current is $F(x) \times (L^2/F(x)) = L^2$, thus being equivalent to the element at around the center.

Since the photoconductivity of the photoelectric converting device 40 rises at the end part as shown in the solid line of FIG. 5(B), the photoelectric current of each element when the light with the distribution indicated by the solid line of FIG. 5(C) arrived becomes as indicated by a broken line in FIG. 5(C), thus becoming uniform over all elements.

For reference, actual data of the photoconductive converting device 40 manufactured for a trial according to the present invention will be shown below.

The element density is set at 8 elements/mm and the total number of elements is 1728 units. The value of F(x) at the end part is 0.8, and the area $L^2$ of the light receiving electrode part DV of the divided electrode 51 is 12500 $\mu m^2$ with L being 100 $\mu m$.

Glass or ceramic is used for the material of the substrate 41. For forming the divided electrodes, 51, 52, ... chromium is deposited over the surface of the substrate 41 to the thickness of about 3000 Å by the electronic beam vacuum evaporation coating method, and a pattern is formed by ordinary photolithography method. On the divided electrodes the photoconductive layer 42 of amorphous silicon is formed to the thickness of about 1 $\mu m$ at the vapor deposition rate of about 167 Å/min. The conditions set for this trial manufacture are the substrate temperature from 200 to 300° C., air pressure from 0.2 to 1.0 Torr, electrode interval from 20 to 50 mm, high frequency output for discharge from 10 to 100 W, and gas flowrate from 10 to 50 sccm. For forming the layer, from about 1/1000 to about 1/10000 part of $B_2H_2$ gas is mixed with one part of silane gas, and further approximately 0.01 weight % of $O_2$ and $H_2O$ are mixed. It is known that the element of excellent dark current characteristic can be obtained by the above method. Then, the common electrode 43 of ITO is formed to the thickness of about 1500 Å by the Ar—$O_2$ reactive dc spattering method.

The characteristic was examined by applying a voltage of $-5$ V to the common electrode 43 of the photoelectric converting device 40 produced under the above conditions, and the favorable result was obtained as shown in the broken line of FIG. 5(C). It is to be expressly understood, however, that the above example is for the purpose of reference only and is not intended as a definition of the limits of the invention.

In the above embodiment, though the shape of the light receiving electrode part DV of each divided electrodes 51, 52, ... was assumed to be the square form, photoelectric current of such photoelectric converting device is porportional to the area of the light receiving electrode part DV as described above, and the shape is not limited to the square form.

Further, in the case of such photoelectric converting device, since the area of the light receiving part is substantially determined by the overlapped portion of the divided electrode and the common electrode between which the photoconductive layer is sandwiched, an alternate embodiment may be conceived wherein the size and the shape of the divided electrode itself are made identical in all elements, and photoelectric current to be obtained from each element is uniformed by changing the degree of overlapping of the divided electrode and the common electrode or each of these two electrodes and the photoconductive layer.

Figure 6:
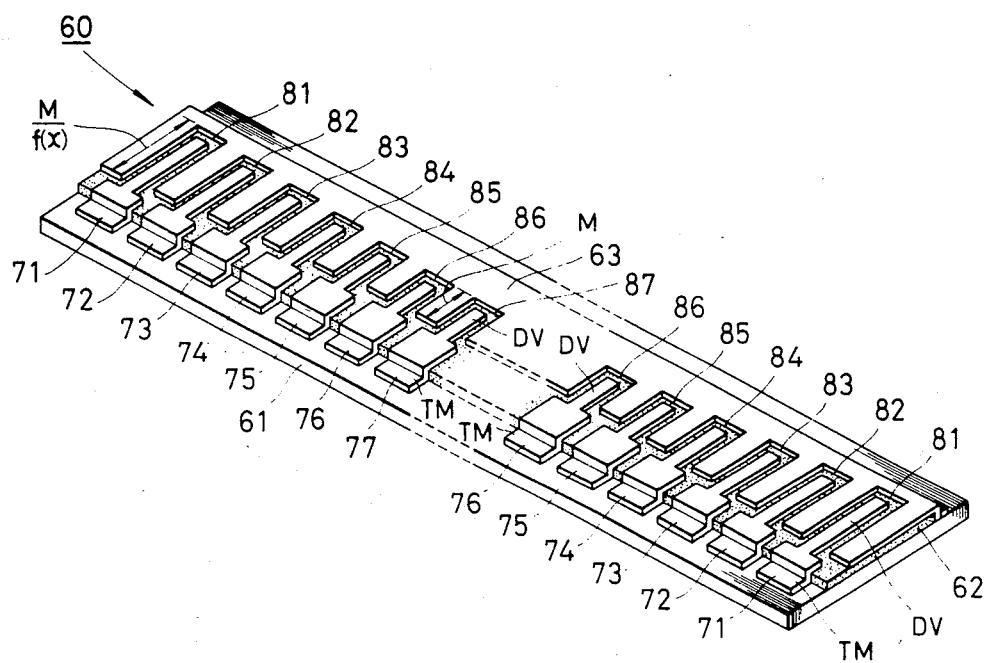
FIG. 6 illustrates another embodiment of the photoelectric converting device of the present invention.
Figure 7:
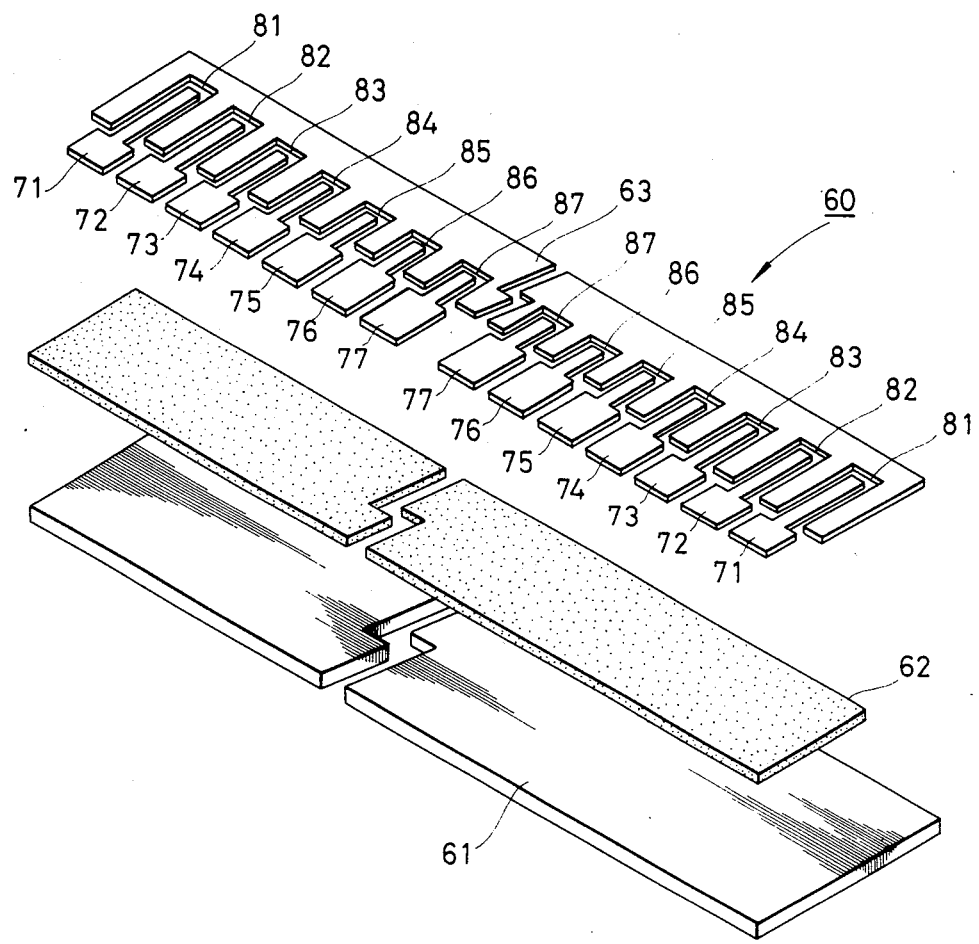
FIG. 7 illustrates the photoelectric converting device of FIG. 6 in a disassembled state.

FIG. 6 shows the structure of the planer type photoelectric converting device to which the present invention is applied as another embodiment of the present invention, and FIG. 7 is a disassembled view of this embodiment. In FIGS. 6 and 7, a photoconductive layer 62 is formed on a substrate 61, and a common electrode 63 and divided electrodes 71, 72, ... are provided thereon as shown.

Each of the divided electrodes 71, 72, ... consists of a light receiving electrode part DV and a lead electrode part TM, and the common electrode 63 has notches 81, 82, ... corresponding to the divided electrode 71, 72 .. . These notches 81, 82, ... are formed so that when the depth of the notch positioned in center, i.e., the distance from the outer end to the inner end is taken as M, the depth of the notch around the end of the photoelectric converting device 60 becomes M/F(x). The light receiving parts DV of the divided electrodes 71, 72, ... are arranged at a fixed distance from the notches 81, 82, ... that is, a single photoelectric conversion element is formed by the combination of the common electrode 63, a notch, a divided electrode, and the photoconductive layer 62, and light arrives at the photoconductive layer 62 directly without the aid of an optical system.

Through the elements of the photoelectric converting device 60 thus structured, photoelectric current flows proportional to the distance M/F(x). Accordingly, when a light of intensity F(x) arrives at the elements, the photoelectric current flowing through any element becomes $F(s) \times (M/F(c)) = M$, and the equivalent photoelectric current is obtained from all of the elements.

Though the above two embodiments are so designed that the same photoelectric current can be obtained from each element by appropriately determining the area of the light receiving part of each element, the same effect may be obtained by appropriately determining the transmittivity of the electrodes or the photoconductivity of the photoconductive layer. That is, since the aim is to make the photoconductive characteristic of the photoelectric converting device be as shown in FIG. 5(B), in the case of the sandwitch type photoelectic converting device of the first embodiment, a satisfactory result may be obtained by determining the transmittivity of the ITO layer (or other material) of the common electrode to uneven characteristic such that it increases at the end part so as to obtain photoconductive characteristic as shown in FIG. 5(B), or by determining the photoconductivity of the photoconductive layer as shown in FIG. 5(B), while in the case of the planer type photoelectric converting device of the second embodiment, it is only required that the photoconductivity of the photoconductive layer which receives light directly is determined as shown in FIG. 5(B). Of course, when the same photoelectric current is obtained by the above manners, there is no need to vary the area of the light receiving part of each element. In addition, the present invention can also be applied to CCD type or MOS type photoelectric converting device.

What is claimed is:

1. A photoelectric converting device for reading a portion of an original graphic representation illuminated by a source of light, said photoelectric converting device comprising a plurality of photoelectric conversion elements each having its own sensitive area for performing photoelectric conversion with a sensitivity proportional to the intensity of light incident on said original graphic representation, said plurality of photoelectric conversion elements being arrayed, in the direction of the width of said original to be read, to form a strip type photoelectric converting device of a length corresponding to the width of said original, the photoelectric conversion efficiency of said photoelectric conversion elements disposed near each end of the array being higher than that of the photoelectric conversion elements disposed around the center, the photoelectric conversion efficiency of each of said photoelectric conversion elements being varied according to its position by variation of respective sensitive areas, the light receiving area of the photoelectric conversion elements disposed around each end being larger than that of photoelectric conversion elements disposed around the center, said sensitive areas being symmetrical along mutually perpendicular straight lines, said strip type photoelectric converting device being a sandwich type formed by superposing a plurality of divided electrodes, a photoconductive layer, and a common electrode one over another on an insulating substrate with said light receiving area determined by the overlapping area of said divided electrode and said common electrode.

2. A photoelectric converting device as in claim 1, wherein each of the sensitive areas defines a square.

3. A photoelectric converting device as in claim 2, wherein each of said squares have centers which are uniformly spaced with respect to each other.

4. A photoelectric converting device for reading a portion of an original graphic representation illuminated by a source of light, said photoelectric converting device comprising a plurality of photoelectric conversion elements each having its own sensitive area for performing photoelectric conversion with a sensitivity proportional to the intensity of light incident on said original graphic representation, said plurality of photoelectric conversion elements being arrayed, in the direction of the width of said original to be read, to form a strip type photoelectric converting device of a length corresponding to the width of said original, the photoelectric conversion efficiency of said photoelectric conversion elements disposed near each end of the array being higher than that of the photoelectric conversion elements disposed around the center, the photoelectric conversion efficiency of each of said photoelectric conversion elements being varied according to its position by variation of respective sensitive areas, the light receiving area of the photoelectric conversion elements disposed around each end being larger than that of photoelectric conversion elements disposed around the center, said sensitive areas being symmetrical along mutually perpendicular straight lines, said strip type photoelectric converting device being a sandwich type with the superposition of a plurality of divided electrodes, a photoconductive layer, and a phototransmissive common electrode on the insulating substrate one over another, the photoelectric conversion efficiency of said photoelectric conversion elements disposed around each end being raised by increasing the phototransmissivity of said common electrode around each end to a value higher than that of said common electrode around the center by having varying contents in the ITO layer of said common electrode.

5. A photoelectric converting device for reading a portion of an original graphic representation illuminated by a source of light, said photoelectric converting device comprising a plurality of photoelectric conversion elements each having its own sensitive area for performing photoelectric conversion with a sensitivity proportional to the intensity of light incident on said original graphic representation, said plurality of photoelectric conversion elements being arrayed, in the direction of the width of said original to be read, to form a strip type photoelectric converting device of a length corresponding to the width of said original, the photoelectric conversion efficiency of said photoelectric conversion elements disposed near each end of the array being higher than that of the photoelectric conversion elements disposed around the center, the photoelectric conversion efficiency of each of said photoelectric conversion elements being varied according to its position by variation of respective sensitive areas, the light receiving area of the photoelectric conversion elements disposed around each end being larger than that of photoelectric conversion elements disposed around the center, said sensitive areas being symmetrical along mutually perpendicular straight lines, said strip type photoconductive converting device being a sandwich type with the superposition of a plurality of divided electrodes, a photoconductive layer, and a common electrode one over another on an insulating substrate, the photoelectric conversion efficiency of the photoelectric elements disposed around each end being raised by making the photoconductivity of said photoconductive layer in the photoelectric conversion elements disposed around each end higher than that of said photoconductive layer in the photoelectric conversion elements disposed around the center by a variable ratio of contents in said photoconductive layer.

6. A photoelectric converting device as in claim 5 wherein the ratio of contents of the parts of the photoconductive layer has variable amounts of dopant.

* * * * *